US011002801B2

(12) United States Patent
Davis et al.

(10) Patent No.: US 11,002,801 B2
(45) Date of Patent: May 11, 2021

(54) DEVICES, SYSTEMS AND PROCESSES FOR CAPACITOR TESTING

(71) Applicant: DISH Network L.L.C., Englewood, CO (US)

(72) Inventors: Rodney Davis, Parker, CO (US); Jamie Metzger, Aurora, CO (US); Ken Jones, Palmer Lake, CO (US)

(73) Assignee: DISH Network L.L.C., Englewood, CO (US)

(*) Notice: Subject to any disclaimer, the term of this patent is extended or adjusted under 35 U.S.C. 154(b) by 217 days.

(21) Appl. No.: 16/255,954

(22) Filed: Jan. 24, 2019

(65) Prior Publication Data

US 2020/0241065 A1     Jul. 30, 2020

(51) Int. Cl.
*G01R 31/64* (2020.01)
*G01R 1/30* (2006.01)

(52) U.S. Cl.
CPC .............. *G01R 31/64* (2020.01); *G01R 1/30* (2013.01)

(58) Field of Classification Search
CPC .................................. G01R 31/64; G01R 1/30
USPC .......................................................... 324/548
See application file for complete search history.

(56) References Cited

U.S. PATENT DOCUMENTS

| | | | |
|---|---|---|---|
| 6,052,748 A * | 4/2000 | Suominen | G06J 1/00 375/372 |
| 6,424,158 B2 * | 7/2002 | Klang | H02J 7/0071 324/433 |
| 7,394,166 B2 * | 7/2008 | Teichmann | F03D 7/0284 290/44 |
| 7,715,919 B2 * | 5/2010 | Osorio | A61N 1/36135 607/45 |
| 9,276,463 B2 * | 3/2016 | Fleming | H02M 3/158 |
| 9,429,992 B1 * | 8/2016 | Ashenbrenner | G06F 13/4081 |

OTHER PUBLICATIONS

Chroma ATE, "Ripple Current Tester Model 11800/11801/11810", Publisher: Chroma ATE, downloaded from Internet on Jan. 24, 2019, from http://www.chromaate.com/product/11800_11801_11810_Ripple_Current_Tester.htm.
Chroma ATE, "1820 Overview E", Publisher: Chroma, downloaded from Internet on Jan. 24, 2019, from http://www.chromaate.com/product/capacitor_test_system_1820.htm.

* cited by examiner

*Primary Examiner* — Christopher P McAndrew
(74) *Attorney, Agent, or Firm* — Wash Park IP Ltd.; John T. Kennedy

(57) ABSTRACT

Various embodiments of the present disclosure describe devices, systems, and processes for testing capacitors. For an embodiment, a system includes a digital signal processor configured to execute non-transient computer executable instructions for testing a device over at least three operating modes. The operating modes may include a start-up mode, during which the digital signal processor is configured to control initial charging of the device to a desired initial condition, a charge mode, during which the digital signal processor is configured to control replenishment of electrical energy in the device, and a test mode, during which the digital signal processor is configured to control testing of the device in accordance with at least one testing protocol. The device may include an energy capture circuit configured to capture recovered energy arising during a first test cycle and to provide the recovered energy to the device for use during a second test cycle.

20 Claims, 4 Drawing Sheets

DEVICES, SYSTEMS AND PROCESSES FOR CAPACITOR TESTING

TECHNICAL FIELD

The technology described herein generally relates to devices, systems, and methods for testing electrical devices. More specifically, the technology described herein relates to devices, systems and method for testing capacitors. The technology described herein also relates to devices, systems and methods for efficiently testing electrical devices, such as capacitors, by capturing and reusing electrical energy used in testing a first capacitive device for second and subsequent testing of additional capacitive devices.

BACKGROUND

Capacitors are integral parts of nearly all circuits utilized in electrical and electronic equipment. Typically, capacitors are qualified and verified to provide certain operating performances and to provide certain degrees of product reliability. However, poor component design, faulty manufacturing techniques, faulty materials and other conditions may give rise to premature failure of capacitors. To address such concerns, capacitors typically need to be tested to verify a manufacturer has, in fact, complied with desired device specifications. Often such testing involves numerous hours of testing supplied devices under specified voltage, current, frequency, temperature and/or other conditions while device performance characteristics are monitored. Further, often many hundred devices, of various types are desired to be tested. Such testing can also occur at frequencies ranging from low frequencies, such as 120 Hz, to high frequencies, such as 100 kHZ, or to very-high frequencies, such as 1 MHz. Further, testing of capacitors ideally occurs under controlled temperature conditions. Commonly these conditions are provided by testing the capacitors in a controlled environment, such as in a thermal chamber or the like.

Yet, existing capacitor testing solutions, such as those provided by Chroma ATE Inc. and other entities, however, commonly support small sample sizes, such as test samples of twenty devices or less. Further, often only a given type of capacitor device may be tested at any given time, including but not limited to polymer, electrolytic, surface mount, ceramic, and other types of devices. Likewise, existing solutions commonly do not support the wide variability of capacitor device types, such as the testing frequency, voltage, current, temperature control or other factors that influence each device's operating characteristics while under test conditions. Additionally, solutions available today commonly do not provide for the individual control of each capacitor under test. Instead, solutions such as those provided by Chroma ATE Inc. provide for the serial or parallel testing of capacitors and not the individual control of multiple capacitors under test. The testing of capacitors also commonly results in a significant portion of the energy utilized for testing a given device being wasted. That is, such testing often incurs significant energy costs as the electrical energy used to test a given device is often shunted as heat or otherwise discharged to a ground potential. Often more than 97% of the energy used in capacitor device testing ends up being so shunted. Thus, devices, systems and methods are needed for addressing the above and related problems.

SUMMARY

The various embodiments of the present disclosure relate in general to devices, systems, and processes for use in testing capacitors. In accordance with at least one embodiment of the present disclosure, a device testing system may include a digital signal processor configured to execute non-transient computer executable instructions for testing a device over at least three operating modes including a start-up mode, during which the digital signal processor is configured to control initial charging of the device to a desired initial condition; a charge mode, during which the digital signal processor is configured to control replenishment of electrical energy in the device; and a test mode, during which the digital signal processor is configured to control testing of the device in accordance with at least one testing protocol.

For at least one embodiment, the device testing system may include an energy capture circuit. The energy capture circuit may be coupled to the device and configured to capture recovered energy arising during testing of the device during a first test cycle. The energy capture circuit may also be configured to provide the recovered energy to the device for use during a second test cycle.

For at least one embodiment, the device testing system may include use of a digital signal processor configured to control selective coupling of the device to a primary power source during the start-up mode. For at least one embodiment, a control circuit may be coupled to the digital signal processor and include a first switch selectively coupling the device with the primary power source. The control circuit configure the first switch to selectively couple the device to the primary power source during charge mode and to decouple the device from the primary power source during test mode.

For at least one embodiment, a device testing system may include use of a first switch that is closed by a control circuit during start-up mode and until a digital signal processor detects one or more initial conditions arising in the device.

For at least one embodiment, a device testing system may include use of a primary power source that includes a variable power supply controlled by the digital signal processor.

For at least one embodiment, a device testing system may include use of a control circuit, coupled to a digital signal processor. The control circuit may include a first switch selectively coupling the device with a primary power signal and a second switch selectively coupling the device with an energy capture circuit. The control circuit may also configure the first switch to selectively couple the device to a primary power source during charge mode and to decouple the device from the primary power source during test mode. The control circuit may also configure the second switch to selectively couple the device to the energy capture circuit during charge mode and to decouple the device from the energy capture circuit during test mode.

For at least one embodiment, a device testing system may include use of a control circuit, coupled to the digital signal processor, that includes a first switch selectively coupling the device with a primary power signal, a second switch selectively coupling the device with an energy capture circuit, and a third switch selectively coupling the device with a primary neutral node. The control circuit may configure the first switch to selectively couple the device to the primary power source during charge mode and to decouple the device from the primary power source during test mode. The control circuit may configure the second switch to selectively couple the device to the energy capture circuit during charge mode and to decouple the device from the energy capture circuit during test mode. The control circuit may configure the third switch to selectively couple the device to a primary neutral node during test mode and to decouple the device from the primary neutral node during charge mode.

For at least one embodiment, a device testing system may include use of a control circuit which may configure a first switch based upon a first control signal received from a digital signal processor. The control circuit may also configure a second switch based upon a second control signal received from the digital signal processor and may configure a third switch based upon a third control signal received from the digital signal processor.

For at least one embodiment, a device testing system may include use of a control circuit, coupled to the digital signal processor, that includes a Hi switch coupling the device to an energy capture circuit and a Lo switch coupling the device to a primary neutral node. The digital signal processor may be configured to instruct the control circuit to configure the Hi switch and the Lo switch into polar opposite configurations during at least one of charge mode and test mode.

For at least one embodiment, a device testing system may include use of a measurement circuit, coupled to the device, a control circuit, and to a digital signal processor, that is configured to detect and output to the digital signal processor a signal representative of a current provided to the device during at least one of a start-up, charge and test modes.

For at least one embodiment, a device testing system may include use of a measurement circuit, coupled to the device, a control circuit, and to a digital signal processor that is configured to detect and output to the digital signal processor a signal representative of a peak-to-peak voltage provided to the device during at least one of a start-up, charge and test modes.

For at least one embodiment, a device testing system may include use of a measurement circuit, coupled to the device, a control circuit, and to a digital signal processor, that is configured to detect and output to the digital signal processor a signal representative of a peak voltage provided to the device during at least one of a start-up, charge and test modes.

For at least one embodiment, a device testing system may include use of an environmental control circuit, coupled to the digital signal processor, configured to monitor and adjust environmental conditions for the device during test mode.

For at least one embodiment, a device testing system may include use of an energy capture circuit that includes at least one capacitive device.

In accordance with at least one embodiment of the present disclosure a method for testing a device may include one or more operations, including coupling a device under test with an energy capture circuit to provide a recovered voltage to the device under test. For at least one embodiment, the operations may include, upon providing of the recovered voltage to the device under test, measuring the current voltage of the device under test and determining whether the current voltage is substantially equal to a desired test voltage. For at least one embodiment, the operations may include, when the current voltage is less than the desired test voltage, coupling the device under test with a primary power source while monitoring voltages arising across the device under test until the current voltage is substantially equal to the desired test voltage. For at least one embodiment, the operations may include decoupling the device under test from the primary power source and decoupling the device under test from the energy capture circuit. For at least one embodiment, when the current voltage is substantially equal to the desired test voltage, the operation may include first testing the device, monitoring voltages and currents arising across the device during first testing and discharging the device.

In accordance with at least one embodiment of the present disclosure a method for testing a device may include one or more operations, including operations arising where the recovered energy is captured by the energy capture circuit during a prior testing of the device that immediately preceded the first testing of the device.

In accordance with at least one embodiment of the present disclosure a method for testing a device may include one or more operations, including those where the energy capture circuit and the device under test are initially charged by a primary power source controlled by a digital signal processor. For at least one embodiment, the device under test may be selectively coupled to the primary power source by a first switch configured by a control circuit based upon a first control signal received from the digital signal processor. For at least one embodiment, the energy capture circuit may be selectively coupled to the device under test by a second switch. For at least one embodiment, the second switch may be selectively configured by the control circuit based upon a second control signal received from a digital signal processor. For at least one embodiment, the device under test may be selectively coupled to a primary neutral node by a third switch. The third switch may be selectively configured by the control circuit based upon a third control signal received from the digital signal processor. The third switch may be open during first testing of the device and may be closed to discharge the device. The second switch and the third switch may be configured in polar opposite configurations during first testing and discharging the device.

In accordance with at least one embodiment of the present disclosure, a capacitor testing system, may include a digital signal processor configured to execute non-transient computer executable instructions for testing a device over at least three operating modes, including a start-up mode, during which the digital signal processor is configured to control initial charging of the device to a desired initial condition, a charge mode, during which the digital signal processor is configured to control replenishment of electrical energy in the device, and a test mode, during which the digital signal processor is configured to control testing of the device in accordance with at least one testing protocol. The system may also include an energy capture circuit, coupled to the device and configured to capture recovered energy arising during testing of the device during a first test cycle and further configured to provide the recovered energy to the device for use during a second test cycle. The system may also include a control circuit, coupled to the digital signal processor, and including a first switch selectively coupling the device with a primary power source, a second switch selectively coupling the device with the energy capture circuit, and a third switch selectively coupling the device with a primary neutral node. The control circuit may also configure the first switch to selectively couple the device to the primary power source during charge mode and to decouple the device from the primary power source during test mode. The control circuit may also configure the second switch to selectively couple the device to the energy capture circuit during charge mode and to decouple the device from the energy capture circuit during test mode. The control circuit may also configure the third switch to selectively couple the device to a primary neutral node during test mode and to decouple the device from the primary neutral node during charge mode. The system may also include a measurement circuit, coupled to the device, the control circuit, and to the digital signal processor and configured to detect and output to the digital signal processor a signal representative of a current provided to the device during at least one of the start-up mode, the charge mode and the test mode. The measurement circuit may be configured to detect and output to the digital signal processor a signal representative of a peak-to-peak voltage provided to the device during at least one of the start-up mode, the charge mode, and the test mode. The measurement circuit may be configured to detect and output to the digital signal processor a signal representative of a peak voltage provided to the device during at least one of the start-up mode, the charge mode, and the test mode. The system may include an environmental control circuit, coupled to the digital signal processor, configured to monitor and adjust environmental conditions for the device during at least the test mode.

BRIEF DESCRIPTION OF THE DRAWINGS

The features, aspects, advantages, functions, modules, and components of the devices, systems and methods provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

DETAILED DESCRIPTION

The various embodiments described herein are directed to devices, systems, and methods for use in testing capacitor devices.

Figure 1:
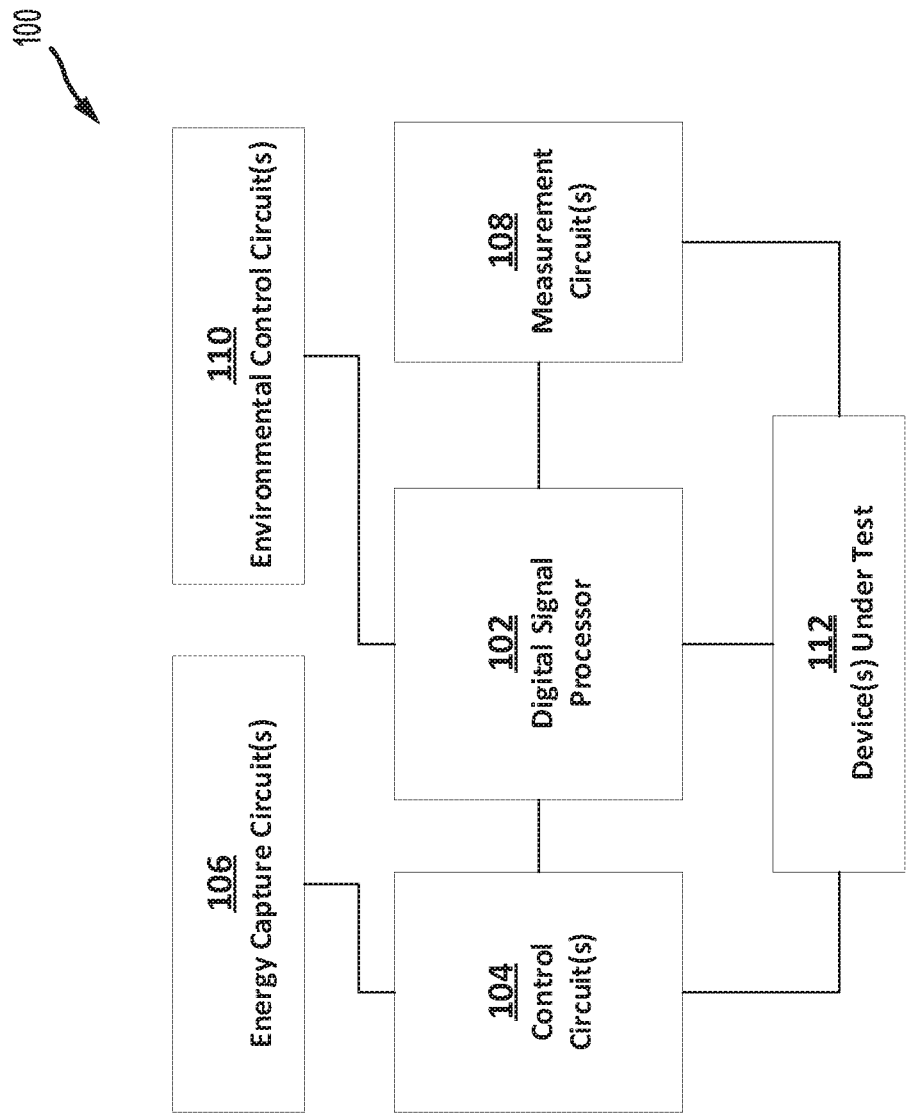
FIG. 1 is schematic diagram of a system for testing capacitors in accordance with at least one embodiment of the present disclosure.

As shown in FIG. 1, for at least one embodiment of the present disclosure, a system 100 for testing a device under test (a "DUT") 112, such as a capacitor, may include a digital signal processor 102, at least one device under test control circuit (hereafter, the "control circuit") 104, at least one energy capture circuit 106, at least one DUT measurement circuit (hereafter, the "measurement circuit") 108, and at least one environmental control circuit 110. As shown, each of these circuits are suitably coupled to the digital signal processor 102 and the given DUT 112. More specifically, each of these circuits may be configured to control the testing, measurement and environmental (for example, thermal) properties of one or more DUTs, as directed by one or more algorithms or non-transitory computer executable instructions programmed into and/or accessible by the digital signal processor 102. Such algorithms may be stored non-transiently in one or more memory or other data and/or instruction storage devices provided separately, in conjunction with, or accessible by the digital signal processor 102. Examples of such data storage devices are well known in the art and are not further described or limited to any specific types of storage devices.

For at least one embodiment, the digital signal processor 102 may be any suitable signal processing device that may be configured to variably monitor and control one or more operating parameters of one or more DUTs 112. It is to be appreciated that for at least one embodiment, the digital signal processor 102 may be configured and/or configurable to individually, and/or in any desired groupings, one or more DUTs. Further, for at least one embodiment, the digital signal processor 102 may be configured to control and monitor the testing of one or more different types of DUTs and one or more of such DUTs themselves may have varying operating characteristics, electrical, mechanical and/or environmental (for example, thermal) properties, under which testing occurs. That is, for at least one embodiment of the present disclosure the system 100 may be configured to test varying types of DUTs at substantially the same time, and according to the same or varying testing parameters. Such testing parameters may include the use of varying switching frequencies, peak voltages, minimum voltages, RMS voltages and currents, operating temperatures and otherwise.

For at least one embodiment, the digital signal processor 102 is an ADSP-BF707 digital signal processor manufactured by Analog Devices Inc. For other embodiments, other forms of digital signal processors may be utilized. It is to be appreciated that the digital signal processor 102 may be configurable and/or expandable to control the testing of any number of DUTs 112. Expansion boards and the like may be used, as desired, to facilitate the testing of multiple devices. In accordance with at least one embodiment, more than 200 DUTs may be tested simultaneously using at least one embodiment of the system 100 of the present disclosure.

For at least one embodiment, the digital signal processor 102 may be coupled to an internally provided or externally provided oscillator. Such oscillator may be configured to provide clocking signals to the digital signal processor 102 which facilitate DUT testing at one or more fixed or varying frequencies. For at least one embodiment, such testing frequency ranges may arise between 120 Hz and 1 MHz. For at least one embodiment, where a test frequency of 100 KHz is utilized, the oscillator operates at 25 MHz+/−50 PPM over a temperature range of −10 to +70 degrees Celsius. It is to be appreciated that other oscillators may be used for other ranges of test frequencies, operating temperatures, or otherwise.

For at least one embodiment, the digital signal processor 102 may be configured to control one or more fixed and/or variable power supply devices. Each of such power supply devices may be configured to provide electrical energy to one or more DUTs. For at least one embodiment, each DUT may be tested using a unique power supply device. For other embodiments, two or more DUTs may be tested using a single power supply device. Other configurations and/or coupling of DUTs and power supply devices, variable or otherwise, may be utilized in conjunction with other embodiments of the present disclosure.

As further shown in FIG. 1, the system may include a control circuit 104 configured to control the testing of one or more DUTs 112. Such control circuit may be configured to control include varying or fixed operating currents, voltages, frequencies or the like. The control circuit 104 may be coupled to the digital signal processor (DSP) 102, and based on output signals from such DSP 102 control one or more of the test conditions for the DUT 112. For at least one embodiment, the control circuit 104 may be controlled by the DSP 102 such that a constant operating current is provided to the DUT during testing. Such constant operating current may be provided by varying delay periods between the switching of a given one or more DUTs between a charging period and a discharging period of a given test cycle. It is to be appreciated that delay periods may vary from one given test cycle to another.

Figure 2:
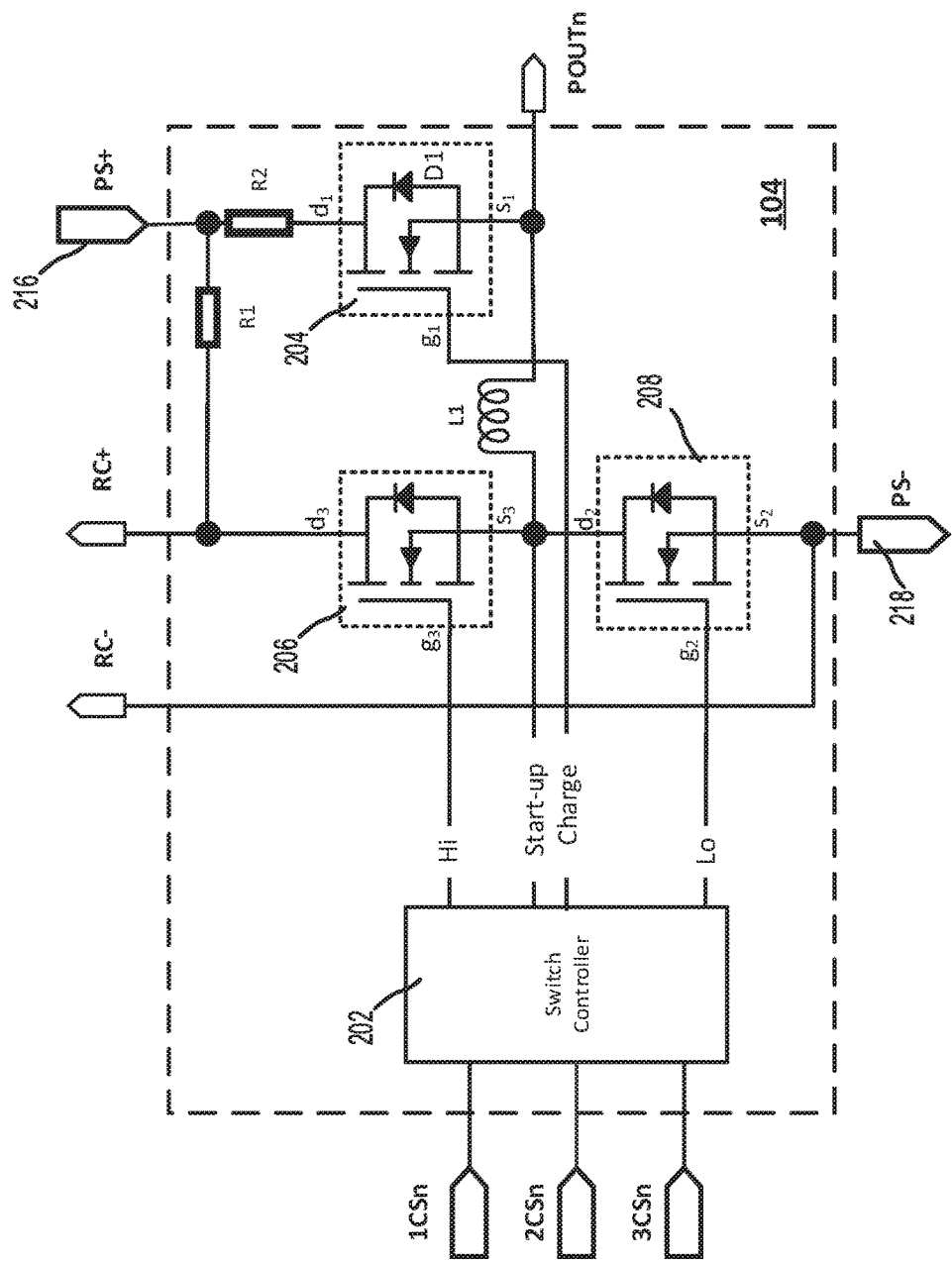
FIG. 2 is a schematic diagram of a control circuit for use in testing capacitors in accordance with at least one embodiment of the present disclosure.

As shown in FIG. 2 for at least one embodiment of the present disclosure, a control circuit 104 may be configured to receive at least three control signals output by the DSP 102. Such control signals may include a first control signal 1CSn, where "n" herein indicates a particular sequence number of one or more DUTs), a second control signal 2CSn, and a third control signal 3CSn. Connections to and signals for a primary power signal PS+, from a primary power source, and a primary neutral signal PS−, from a primary neutral node, are also provided to the control circuit 104. For at least one embodiment, an electrical current provided across the primary power PS+ is provided by a variable power supply controlled by the DSP 102. In other embodiments, the electrical current provided across the primary power PS+ is provided at fixed voltage potentials. For at least one embodiment, the electrical current is provided using direct current signals. It is to be appreciated that the DSP 102 may be configured to adjust the amount of electrical current provided in the primary power signal PS+ based upon then arising operating conditions, measured properties of a DUT 112, testing parameters or otherwise. One or more algorithms, including one or more sequences of operations, may be utilized to configure the DSP 102 and, when executed by the DSP 102, configure one or more variable power supplies coupled to the DSP 102 to provide desired primary power signals to the control circuit 104.

As further shown in FIG. 2, for at least one embodiment of the present disclosure, a control circuit 104 may be configured to output a first output signal POUTn to a DUT 112. The POUTn signal may be provided to one or more DUTs 112, and is used to control the charging and discharging of such one or more DUTs, under certain conditions, such as at a given or varying frequency, current, voltage, or otherwise. Accordingly, it is to be appreciated that for at least one embodiment, the control circuit 104 may be configured to control the providing of the first output signal POUTn at desired voltages and currents, at various and/or fixed frequencies, to one or more DUTs based upon one or more control signals provided by the DSP 102. For at least one embodiment, such desired voltage is 50 volts and current is 8 amps.

As further shown in FIG. 2, for at least one embodiment of the present disclosure, a control circuit 104 may also be configured to facilitate the recovery and reutilization of electrical energy utilized during testing of a DUT. As shown in FIG. 2, the control circuit 104 may be configured to provide a second output signal and a third output signal (identified respectively in FIG. 2 as the first and second recovery signals, "RC+" and "RC−"). For at least one embodiment, the third output signal RC− may be coupled to and have the same potential as the primary neutral signal PS−. As discussed below and during steady-state testing of a DUT, the second output signal RC+ desirably provides electrical energy at a higher current than is provided by the primary power signal PS+ during steady state testing of a DUT 112. Such higher current representing a portion of the electrical energy that was provided by the primary power signal PS+ during initial DUT charging operations and which has been recaptured prior to a discharge period of a test cycle of a given DUTs 112.

More specifically, for at least one embodiment of the present disclosure, a control circuit 104 is configured to facilitate energy recapture, during a test cycle, and reutilization during a subsequent test cycle, and over various operating modes. For example, the control circuit 104 may be configured to operate across at least four operating modes, under control of the DSP 102, such as a first/start-up operating mode, a second/Charge operating mode, a third/Test operating mode, and a fourth/Discharge operating mode. During one or more of these operating modes, the control circuit 104 may be configured to facilitate charging and discharging of a DUT 112 such that a desired operating condition is realized, such operating condition being expressed, for example, in terms of one or more of a voltage potentials, a switching frequency, a current, an internal device temperature, or otherwise. It is to be appreciated that during one or more of the operating modes, the DUT 112 may be charged fully or partially during one or more charge and discharge periods of a given test cycle.

For at least one embodiment, during start-up mode, the DSP 102 is configured to control an initial charging of the DUT 112 to a desired initial condition. The control circuit 104 may be configured to provide electrical energy directly to the DUT 112 via the primary power signal PS+ to facilitate such initial charging. The primary power signal PS+ is provided to initially charge the DUT 112 to an initial condition, for example, within 20% of a desired operating voltage and at a desired operating current. The DSP 102 may instruct the control circuit 104 to adjust when and for how long the primary power signal PS+ is provided to the DUT 112, by operating a first/charge switch 204, such that the DUT 112 attains the desired initial condition, as expressed as an initial operating voltage and current. More specifically, one or more variable or fixed output power supplies may be operated under the control of the DSP 102. A first/charge switch 204 may be controlled by the DSP 102, via a switch controller 202, so that a DUT 112 may be initially charged up to a initial operating voltage and current prior to testing of the DUT 112. The initial operating voltage and current may be the same of different than test voltages and currents utilized during DUT testing. During start-up mode, electrical energy is generally not shunted or otherwise discharged by the system. Further, during start-up mode, the primary power signal PS+ may be used to provide energy to the energy capture circuit 106 via the first recovery signal RC+. The primary power signal PS+ may be conditioned by a first resistor R1 prior to the primary power signal PS+ being provided to the energy capture circuit 106. A second resistor R2 may facilitate current limiting.

For at least one embodiment, during Charge mode, the DSP 102 is configured to control replenishment of electrical energy in the DUT 112. The control circuit 104 may be configured and instructed by the DSP 102 to provide additional electrical energy to the DUT 112. Charge mode typically arises after an initial start-up mode and/or after a Test mode. During Charge mode, electrical energy is provided to the DUT 112 to ensure testing will occur at the desired electrical voltage and currents. Charge mode may arise at any time during a test cycle and generally is provided to compensate for any energy leakage, through heat, signal propagation losses, or otherwise that is not dissipated and or is not re-captured during testing of the DUT 112. Charge mode is provided to ensure that a DUT 112 is consistently tested under desired testing conditions such as at a desired voltage and current, or as otherwise desired for any given testing scenario. During Charge mode, electrical energy is provided by the primary power signal PS+ to the DUT 112, under control of the control circuit 104 and the DSP 102. For at least one embodiment, electrical energy provided during Charge mode will often vary based on the voltages used to test a given DUT. For an embodiment where a 50 volt DUT is being tested, the electrical energy provided to the 50 volt DUT 112 during Charge mode is typically less than 5% of the electrical energy used during a test cycle for a given DUT 112. For an embodiment where a 9 volt DUT 112 is being tested, the electrical energy provided to the DUT during Charge mode is typically less than 18% of the electrical energy used during a test cycle for a 9 volt DUT 112.

For at least one embodiment, during Test Mode, the DUT 112 is tested in accordance with at least one testing protocol, as directed by the DSP 102. Further, the control circuit 104 may be configured to recapture and reutilize at least a portion of the electrical energy provided by the PS+ signal to the DUT 112. Test mode may overlap in whole or in part with Charge mode. Test mode may arise before or after Charge mode. A delay may occur between transitions between Test mode and Charge mode, such delay may be used to adjust the operating current of the DUT 112 while under test. It is to be appreciated that the DSP 102 may be configured to facilitate such delays and/or overlaps between Charge mode and Test mode. Transitions between Charge mode and Test mode may be used by the control circuit 104 to adjust the switching frequency of the DUT 112 and the frequency of the test cycle. The control circuit 104 may be controlled by the DSP 102 to facilitate such energy recapture and reutilization. For at least one embodiment, during Test Mode, the electrical energy provided in the primary power signal PS+ represents the "total energy" utilized to charge a DUT 112. For each test cycle, the total energy provided to a DUT includes a first/waste energy component and a second/recovered energy component. The first/waste energy component is consumed by the control circuit 104 and/or the DUT 112 itself during testing. Such waste energy may arise as heat, leakage currents, or otherwise. Such waste energy components occur due to inherent device properties, signal propagation inefficiencies and otherwise. The second/recovered energy component includes the total energy provided by the power signals less the waste energy component. The second/recovered energy component is the electrical current, at a desired voltage potential, that the various embodiments of the present disclosure are configured to recapture for use in charging a DUT 112 during a subsequent test cycle, where the test cycle commonly includes a charge period and a discharge period. For at least one embodiment, the second/recovered energy available for a following test cycle is typically greater than 80% of the total energy used during an immediately preceding test cycle. For at least one embodiment, the second/recovered energy may be provided, by the control circuit 104 to the energy capture circuit 106, via the second output signal RC+. The Charge signal may be utilized to control the providing of electrical energy, via the primary power signal PS+, to replenish the total energy available in a DUT 112 for a next test cycle. It is to be appreciated that the actual ratios of waste energy to recovered energy for any given testing environment will vary based upon device characteristics, testing conditions, test cycle, and otherwise. Accordingly, it is to be appreciated that the above ratios are approximations only and any given embodiment may be configured to provide those Charge signals desired to provide then desired DUT testing conditions.

For at least one embodiment, during Discharge mode and under the control of the DSP 102, the control circuit 104 may be configured to shunt any second/recovered energy component to a ground potential. Discharge mode commonly arises after testing of a given DUT 112 is complete or when unexpected and/or anomalous testing conditions occurs, such as a thermal runaway of a DUT, a failure of the DUT, when testing parameters specify repeated test cycles for a fully discharged DUT, or otherwise. The DSP 104 may be configured to detect and respond to such unexpected and/or anomalous conditions, or facilitate any desired testing conditions based upon one or more signals provided by the measurement circuit 108 to the DSP 104.

As further shown in FIG. 2 and for at least one embodiment of the present disclosure, a control circuit 104 may be configured to include a switch controller 202. For at least one embodiment, the switch controller 202 is an HIP4081A manufactured by Renesas Corporation.

The switch controller 202 may be configured to receive and provide start-up signals (not shown) to the first/charge switch 204, second/Hi switch 206 and third/Lo switch 208 during the start-up period. Such signals may condition the switches for subsequent operations during one or more of Charge, Test and Discharge modes. The switch controller 202 may be configured to condition, delay, amplify or otherwise process the start-up signal(s). More specifically, the switch controller 202 may be configured to output the start-up signals, as directed by the DSP 104. For at least one embodiment, a first inductor L1 couples the switch controller 202 with the DUT 112, and a first junction connecting a drain node of the third/Lo switch 208, with a source node of the second/Hi switch 206 and with the switch controller 202. During Start-up mode and Charge mode, for at least one embodiment, energy storage may also be facilitated by use of the first inductor L1.

For at least one embodiment, the switch controller 202 may be configured, under direction of the DSP 102, to control the charging and discharging of a DUT 112 by controlling the operating state of one or more first, second and third switches. For at least one embodiment, the switch controller 202 may be configured as a passive device configured to control such switches based on signals received from the DSP 102, such as the first control signal 1CSn, second control signal 2CSn and the third control signal 3CSn. The switch controller 202 may be configured to condition, delay, amplify or otherwise process signals received from the DSP 102, as desired for any given embodiment. The first, second and third control signals may be processed by the switch controller into respective Charge, Hi and Lo signals. As shown in FIG. 2, these signals may be used to respectively control the "on"/"off" status of each of a first/charge switch 204, a second/Hi switch 206, and a third/Lo switch 208. For at least one embodiment the switch controller 202 is configured to operate at 50 volts and 8 amps RMS, however, other operating voltages and currents may be utilized for any given testing of one or more DUTs 112. The DSP 104 may also be configured to control any delay periods occurring between transitions between the opening and/or closing of one or more of the first switch 204, second/Hi switch 206, and third/Lo switch 208. As discussed above, such delay periods may be utilized such that a desired operating current, RMS or otherwise, is provided to the DUT 112 during one or more test cycles.

For at least one embodiment, each of the first, second and third switches 204-206-208 are field-effect transistor based switches with diodes providing flyback protection. As shown in FIG. 2, the gate nodes "$g_{1-3}$" of the switches 204-206-208 are coupled to the switch controller 202. For at least one embodiment, the drain node "$d_1$" of the first switch 204 is configured to receive the primary power signal PS+ via a first voltage divider circuit formed by resistors R1 and R2. It is to be appreciated that the first voltage divider circuit may be configured such that resistor R1 provides a greater impedance than resistor R2, or vice-versa. The source node "$s_1$" of the first switch 204 is configured to provide the POUTn signal, in parallel, to the DUT 112 and to the first inductor L1. It is to be appreciated that when the first switch 204 is "on" (i.e., "closed" circuited), the system is configured, at least, in Charge mode and electrical energy provided by primary power signal PS+ charges both the first inductor L1 and the DUT 112. For at least one embodiment, the first switch 204 is "on" while the second switch 206 is "off" (i.e., "open" circuited).

As further shown in FIG. 2 and for at least one embodiment, the third/Lo switch 208 and the second/Hi switch 206 may be configured to be polar opposites. That is, when the second switch is "on" the third switch is "off" and vice versa. It is to be appreciated that during start-up mode the third switch 208 is "off" The second switch 206 may be configured to be "on" or "off" depending on whether a given testing environment desires to initially pre-charge one or more energy capture circuit 106 components, such components being further described below. Likewise, it is to be appreciated that the second switch 206 may be configured to be "on" or "off" during Charge mode, which as discussed above occurs when the first switch 204 is "on." The configuring of the second switch 206, during Charge mode, may occur when additional energy is desired to be stored in the energy capture circuit 106 for subsequent test cycles of the DUT 112. Further, it is to be appreciated that the second switch 206 may be configured to be "on" while each of the first switch 204 and the third switch 208 are configured to be "off" Such configuration providing recovered energy captured during a prior test cycle for use during an immediately subsequent test cycle.

Figure 3:
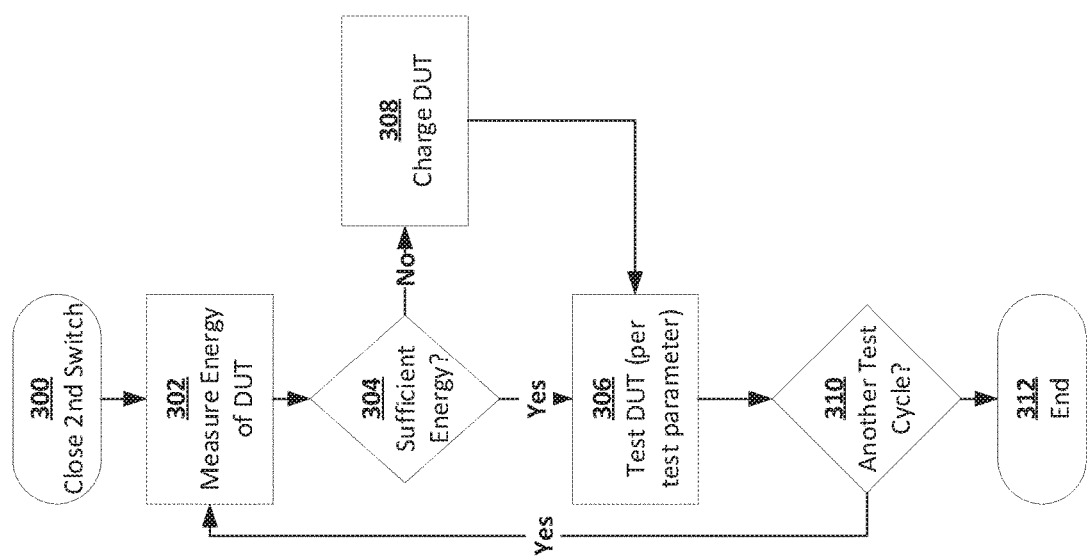
FIG. 3 is a flow chart illustrating one embodiment of a method for testing capacitors in accordance with at least one embodiment of the present disclosure.

Accordingly, after start-up mode and an initial charging of a DUT 112 to a desired electrical potential, for at least one embodiment of the present disclosure, a sequence of operations may proceed by which the DUT 112 is tested over one or more test cycles, as per the process of FIG. 3. For the process of FIG. 3, it is assumed that an initial configuration of the first, second and third switches is one where all of the switches are initially "open." However, other initial test conditions may arise for other embodiments of the present disclosure.

Operation 300: As shown in FIG. 3, the process may proceed with a closing of the second switch 206, upon which any recovered energy stored in energy capture circuit 106 during a prior test cycle is utilized to charge up the DUT 112 for the present test cycle. As discussed above, commonly the recovered energy provided is less than the total energy needed for a given test cycle of a given DUT 112.

Operations 302 and 304: The process continues with the measuring, by for example a measurement circuit 108, and determination by the DSP 102, of the amount of recovered energy provided to the DUT 112 for the current test cycle. It is to be appreciated that various forms of measurement circuits 108 may be utilized. One exemplary embodiment of such a measurement circuit being further described below in conjunction with FIG. 5.

Operation 306: If sufficient recovered energy has been provided to the DUT 112, the current test cycle proceeds with the discharging of the DUT 112, as desired for any desired test parameters. For at least one embodiment, such testing may occur by opening the second switch 206, closing the third switch 208, and measuring the response characteristics of the DUT 112 during at least a discharge portion of a test cycle.

Operation 308: If insufficient recovered energy is available, the DUT 112 may be charged to the desired electrical potential by closing the first switch 204 until a desired energy potential is detected, in the DUT 112, by the measurement circuit 108. The test cycle may then continue with the opening of the first switch 204 and the closing of the second switch 206, or with other sequences of switch operations. It is to be appreciated that electrical potential holding capacity, and/or leakage thereof, of a given DUT 112 may be tested when each of the first, second and third switches are open circuited. For at least one embodiment, Operation 308 occurs for every test cycle. During Operation 308, the DUT 112 is charged to the DUT specified voltage. The width of the charge pulse will typically depend on a length of time, the "charging time", needed to charge the DUT 112 to the specified voltage. It is to be appreciated that such charging time may vary by device, test cycle, primary power signal PS+ voltages and currents provided, or otherwise. Given the use of non-ideal devices, some charging time will typically be needed between each test cycle. Accordingly, for at least one embodiment, Operation 308 may include determinations of charging time used, primary power signal PS+ voltages and currents to use and other determinations. For at least one embodiment, these determinations are performed by the DSP 102 and implemented by the DSP 102 instructing the switch controller 202 via the Charge signal. Further, for at least one embodiment, the DPS 102 may be configured to control the charging time such that a pulse width of the Charge signal does not result in recovered energy being lost back to the power supply providing the primary power signal PS+.

Operation 306: The process may proceed, as desired for any given testing scenario, with testing the DUT 112, per Operation 306. Such testing operations may include, but, do not necessarily have to include, use of a discharge period. During a discharge period, each of the first switch 204 and second switch 206 are open circuited, while the third switch 208 is closed circuited, thereby facilitating discharge of the DUT 112 to the primary neutral potential PS−.

Operation 310: If further test cycles are desired, the process may continue with operations 302-310, until all test cycles are completed.

Operation 312: One all test cycles are completed, a Discharge mode may occur during which the electrical energy previously stored in the DUT 112 and/or in the energy capture circuit 106 may be shunted to the primary neutral potential PS− or otherwise. More specifically and for at least one embodiment, per Operation 312, electrical energy stored in the energy capture circuit 106 and the first inductor L1 may be shunted by configuring each of the second switch 206 and the third switch 208 into open switch configurations while the DSP 102 decreases the primary power signal PS+ by suitably controlling a power provided in the primary power signal PS+ by the primary power source. During Operation 312, the DUT 112 will slowly discharge through the first/Charge switch diode "D1" and the energy capture circuit 106 will slowly discharge through the first resistor R1.

Figure 4:
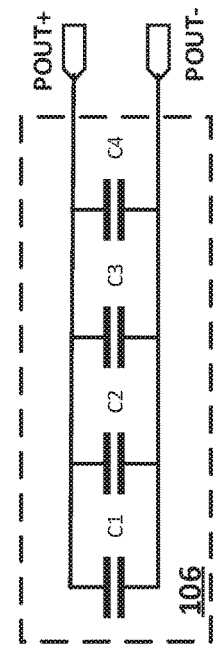
FIG. 4 is a schematic diagram of an energy capture circuit in accordance with at least one embodiment of the present disclosure.

As shown in FIG. 4, for at least one embodiment of the present disclosure an energy capture circuit 106 may be configured to include one or more and/or an array of energy storage devices, such as storage capacitors C1 to C4. It is to be appreciated that any number of storage devices, configurations, and various characteristics thereof may be utilized. For at least one embodiment, each of the storage capacitors C1 to C4 have nominal capacitances of 2.2 µF at 250 V, and within a 20% tolerance. It is to be appreciated that the energy capture circuit 106 may be configured into other device configurations such as inductive energy storage circuits, inductive/capacitive energy storage circuits, or otherwise. For at least one embodiment, the energy capture circuit 106 is configured to facilitate the capture of recovered energy while minimizing any charge energy needed to support testing of a DUT 112 over a desired range of testing frequencies and from one given test cycle to a next test cycle.

Figure 5:
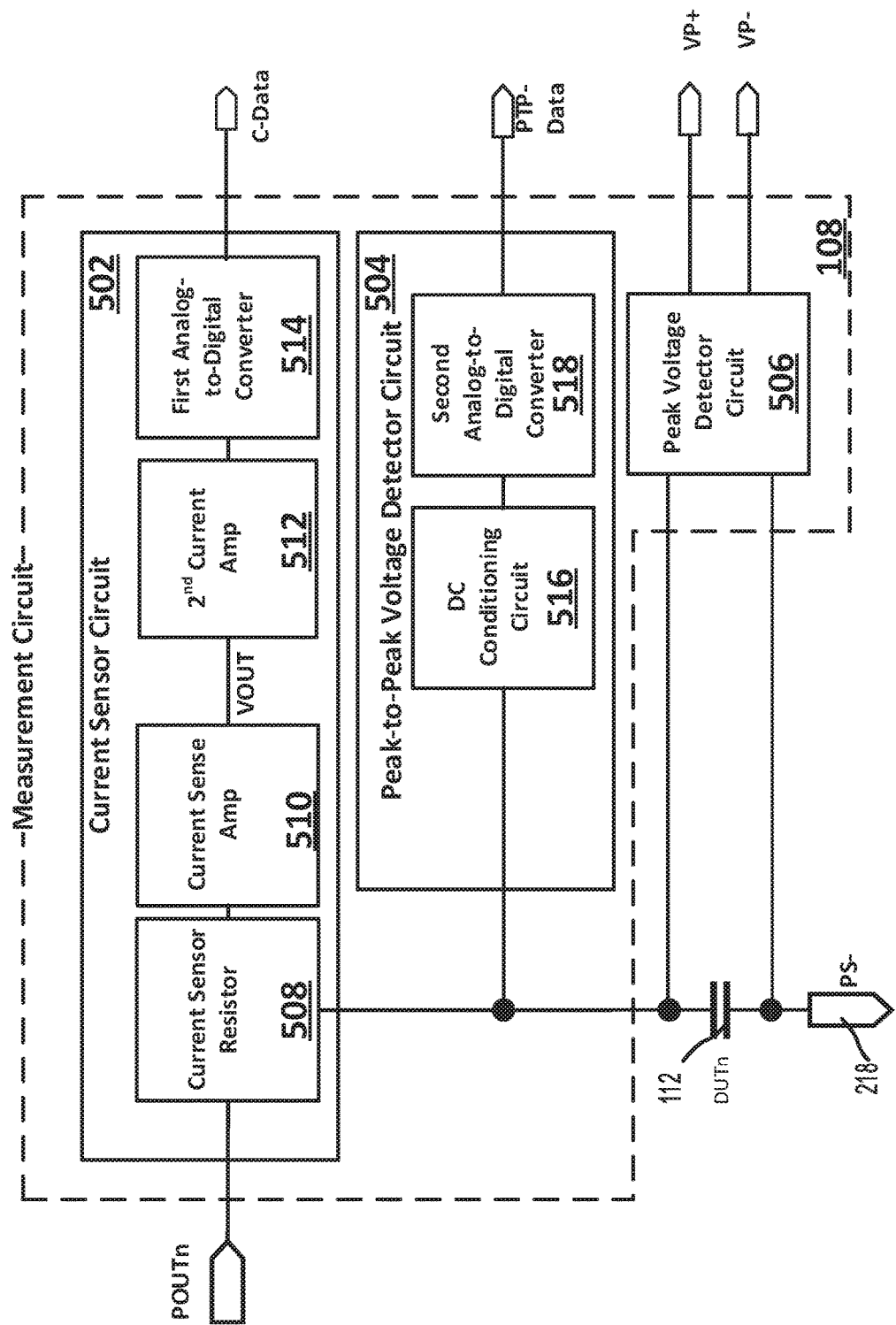
FIG. 5 is a schematic diagram of a measurement circuit in accordance with at least one embodiment of the present disclosure.

As shown in FIG. 5 and for at least one embodiment of the present disclosure, a measurement circuit 108 for testing a DUT 112 may include one or more of a current sensor circuit 502, a peak-to-peak voltage detector circuit 504, and a peak voltage detector circuit 506. It is to be appreciated that one or more of such circuits 502, 504 and 506 may or may not be utilized in conjunction with any given embodiment of the present disclosure. That is, it is to be appreciated that the detection of peak-to-peak voltage or peak voltage may occur without detection of the other characteristics. Likewise, it is to be appreciated that the measurement of an operating current for a DUT 112 may not be needed when the operating current is otherwise fixed or considered to be acceptable stable for one or more testing procedures. Further, while the peak-to-peak voltage detector circuit 504 and the peak voltage detector circuit 502 are shown in FIG. 5 as being coupled to the current sensor circuit 502, it is to be appreciated that such circuits 504 and 506 may be configured to separately and/or jointly receive signals from the DUT 112 and measure the desired parameters without relying on signals provided by the current sensor circuit 502.

As further shown in FIG. 5 for at least one embodiment of the present disclosure, a current sensor circuit 502 may be configured to directly receive from the control circuit the first output signal POUTn. A current sensor resistor 508 may be utilized to couple the POUTn signal to the DUT 112. The first output signal POUTn may be measured across such current sensor resistor 508 by use of a current sense amplifier 510. For at least one embodiment, an LT1999™ High Voltage, Bidirectional Current Sense Amplifier manufactured by Analog Devices, Inc. may be utilized. As is commonly known, the LT1999 current sense amplifier provides for three selectable gains, such as 10V/V, 20V/V and 50V/V. For other embodiments, other types of currents sense amplifiers may be utilized and other voltage gains, programmable, selectable, fixed or otherwise may be utilized. For other embodiments, other forms of current sense amplifiers may be used. The principles of operation of such current sense amplifiers are well known in the art and are incorporated herein by reference.

It is to be appreciated that the current sense amplifier 510 outputs an output voltage, Vout, that indicates both the magnitude and the direction of the sensed current for the first output signal POUTn. For at least one embodiment, a greater resolution in the output voltage Vout may be realized by use of a second current amplifier 512. For at least one embodiment, the second current amplifier 512 may be configured as a programmable gain amplifier, where the gain is adjusted based upon a specificity of testing desired for a given DUT. In accordance with at least one embodiment, the second current amplifier 512 is not used. In accordance with at least one embodiment, the second current amplifier 512 is a MAX9939™ programmable gain amplifier, manufactured by Maxim Integrated, Inc. As is commonly known, the MAX9939 programmable gain amplifier provides for ten (10) programmable gains, such as 0.2V/V, 1V/V, 10V/V, 20V/V, 30V/V, 40V/V, 60V/V, 80V/V, 119V/V and 157V/V. For other embodiments, other types of programmable gain amplifiers may be utilized and other voltage gains, programmable, fixed or otherwise may be utilized. For other embodiments, other forms of programmable gain amplifiers may be used. The principles of operation of such programmable gain amplifiers are well known in the art and are incorporated herein by reference. For at least one embodiment, the second current amplifier 512 may be configured for use as a differential input/differential output programmable gain amplifier, where the programmable gain is adjusted by the DSP 102 (where DSP control signals are not shown in FIG. 5 for purposes of simplicity). It is to be appreciated that the combination of the current sense amplifier 510 and the programmable gain amplifier 512 may be configured to provide a total current sense gain over any desired range. For at least one embodiment, such range includes a gain between 2 to 1570V/V in ten steps.

As further shown in FIG. 5, the second current amplifier 512 may be coupled to and provide a differential output signal to a first analog-to-digital converter (an "ADC") 514. The ADC 514 converts the received signals output by the second current amplifier 512 into a first data stream C-Data for output to the DSP 102. The C-Data signal represents the current provided by the control circuit 104, via the POUTn signal, to the DUT 112. For at least one embodiment, the first ADC 514 may be an AD7356™ manufactured by Analog Devices, Inc. For other embodiments, other forms of ADCs may be used. The principles of operation of such ADCs are well known in the art and are incorporated herein by reference.

As further shown in FIG. 5 and for at least one embodiment, the peak-to-peak detector circuit 504 may be configured to receive the first output signal POUTn provided to the DUT 112. For at least one embodiment, the peak-to-peak detector circuit 504 may be configured to include a conditioning circuit 516. The conditioning circuit 516 may be configured to remove direct current coupling arising in the first output signal POUTn and to facilitate detection of peak voltages in the first output signal POUTn. The conditioning circuit 516 may be coupled to, and configured to protect from voltage surges and provide positive signal biasing for, a second analog to digital converter 518. The second ADC 518 converts the received signals output by the conditioning circuit 516 into a second data stream PTP-Data for output to the DSP 102. The PTP-Data signal represents the peak-to-peak voltage transitions occurring in the POUTn signal output by control circuit 104 to the DUT 112 by selective switching of the first, second and third switches 204-206-208. For at least one embodiment, the second ADC 518 may be an AD7356™ manufactured by Analog Devices, Inc. For other embodiments, other forms of ADCs may be used. The principles of operation of such ADCs are well known in the art and are incorporated herein by reference. For at least one embodiment, a programmable gain amplifier (not shown)

may be used to amplify output signals from the DC conditioning circuit 516 prior to providing of the same of the second ADC 518.

As further shown in FIG. 5 and for at least one embodiment, the peak voltage detector circuit 506 may be configured to detect the peak voltages arising across the DUT 112 and output the same to the DSP 102 as first peak voltage signal VP+ and second peak voltage signal VP−. For at least one embodiment, the peak voltage detector circuit 506 may be configured as a voltage divider circuit, where the voltage of the primary neutral signal PS− is modified by a resistor prior to being output to the DSP as the second peak voltage signal VP−. It is to be appreciated that other forms of peak voltage detector circuits may be used for other embodiments of the present disclosure.

For at least one embodiment of the present disclosure, the system 100 may be configured to include user interface and control functions coupled to the DSP 102. Such user interface and control functions may be provided by use of one or more controllers, such as a micro-controller. Such microcontroller may be configured, in conjunction with presentation devices, such as displays, audible systems, and otherwise, to provide human perceptible output signals indicative of testing arising with respect to one or more DUTs 112. For at least one embodiment of the present disclosure, a PIC18F97J60™ microcontroller manufactured by Microchip Inc. may be utilized. For other embodiments, one or more other forms and/or combinations of microcontrollers may be utilized. The principles of operation of such microcontrollers are well known and are incorporated herein by reference.

As shown in FIG. 1 and referenced above, the system 100 may include an environmental control circuit 110. The environmental control circuit 110 may be configured to control one or more environmental conditions of a DUT 112, such as its temperature. Such conditions may be controlled by the selective engagement of heating circuits, cooling circuits, humidity, pressure or other circuits, herein "environment circuits." The environment circuits may be controlled automatically or via one or more signals provided by the DSP 102 thereto. Further, such environment circuits may be provided uniquely, collectively, or with regards to any combination of DUTs desired for any given embodiment of the present disclosure. It is to be appreciated that the control of one or more environmental conditions for a given DUT may arise with respect to one or more test cycles. For example, an environmental condition for a test cycle may be the same or different than the environmental conditions associated with a preceding or later arising test cycle.

Accordingly, it is to be appreciated that the various embodiments of the present disclosure provide devices, systems, and methods for controlling and capturing energy signals used to test a given DUT 112, such as one or more capacitors.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes only and are not intended to be limiting to any orientation or configuration of any elements or sequences of operations for the various embodiments of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

Further, a reference to a computer executable instruction includes the use of computer executable instructions that are configured to perform a predefined set of basic operations in response to receiving a corresponding basic instruction selected from a predefined native instruction set of codes. It is to be appreciated that such basic operations and basic instructions may be stored in a data storage device permanently and/or may be updateable, but, are non-transient as of a given time of use thereof. The storage device may be any device configured to store the instructions and is communicatively coupled to a processor configured to execute such instructions. The storage device and/or processors utilized operate independently, dependently, in a non-distributed or distributed processing manner, in serial, parallel or otherwise and may be located remotely or locally with respect to a given device or collection of devices configured to use such instructions to perform one or more operations.

What is claimed is:
1. A device testing system, comprising:
    a digital signal processor;
    wherein the digital signal processor is configured to execute non-transient computer executable instructions for testing a device over at least three operating modes comprising:
        a start-up mode, during which the digital signal processor is configured to control initial charging of the device to a desired initial condition;
        a charge mode, during which the digital signal processor is configured to control replenishment of electrical energy in the device;
        a test mode, during which the digital signal processor is configured to control testing of the device in accordance with at least one testing protocol;
    an energy capture circuit, coupled to the device,
        wherein the energy capture circuit is configured to capture recovered energy arising during testing of the device during a first test cycle; and
        wherein the energy capture circuit is configured to provide the recovered energy to the device for use during a second test cycle.

2. The device testing system of claim 1,
wherein the digital signal processor is configured to control selective coupling of the device to a primary power source during the start-up mode.

3. The device testing system of claim 2, comprising:
a control circuit, coupled to the digital signal processor, comprising:
  a first switch selectively coupling the device with the primary power source;
    wherein the control circuit configures the first switch to selectively couple the device to the primary power source during charge mode; and
    wherein the control circuit configures the first switch to decouple the device from the primary power source during test mode.

4. The device testing system of claim 3,
wherein the first switch is closed by the control circuit during start-up mode until the digital signal processor detects the initial conditions arising in the device.

5. The device testing system of claim 2,
wherein the primary power source comprises a variable power supply controlled by the digital signal processor.

6. The device testing system of claim 2, comprising:
a control circuit, coupled to the digital signal processor, comprising:
  a first switch selectively coupling the device with the primary power signal; and
  a second switch selectively coupling the device with the energy capture circuit;
    wherein the control circuit configures the first switch to selectively couple the device to the primary power source during charge mode;
    wherein the control circuit configures the first switch to decouple the device from the primary power source during test mode; and
    wherein the control circuit configures the second switch to selectively couple the device to the energy capture circuit during charge mode;
    wherein the control circuit configures the second switch to decouple the device from the energy capture circuit during test mode.

7. The device testing system of claim 2, comprising:
a control circuit, coupled to the digital signal processor, comprising:
  a first switch selectively coupling the device with the primary power signal;
  a second switch selectively coupling the device with the energy capture circuit; and
  a third switch selectively coupling the device with a primary neutral node;
    wherein the control circuit configures the first switch to selectively couple the device to the primary power source during charge mode;
    wherein the control circuit configures the first switch to decouple the device from the primary power source during test mode;
    wherein the control circuit configures the second switch to selectively couple the device to the energy capture circuit during charge mode;
    wherein the control circuit configures the second switch to decouple the device from the energy capture circuit during test mode;
    wherein the control circuit configures the third switch to selectively couple the device to a primary neutral node during test mode; and
    wherein the control circuit configures the third switch to decouple the device from the primary neutral node during charge mode.

8. The device testing system of claim 7,
wherein the control circuit configures the first switch based upon a first control signal received from the digital signal processor;
wherein the control circuit configures the second switch based upon a second control signal received from the digital signal processor; and
wherein the control circuit configures the third switch based upon a third control signal received from the digital signal processor.

9. The device testing system of claim 1, comprising:
a control circuit, coupled to the digital signal processor, comprising:
  a Hi switch coupling the device to the energy capture circuit; and
  a Lo switch coupling the device to a primary neutral node;
    wherein the digital signal processor is configured to instruct the control circuit to configure the Hi switch and the Lo switch into polar opposite configurations during at least one of charge mode and test mode.

10. The device testing system of claim 9, comprising:
a measurement circuit, coupled to the device, the control circuit, and to the digital signal processor;
  wherein the measurement circuit is configured to detect and output to the digital signal processor a signal representative of a current provided to the device during at least one of the start-up, charge and test modes.

11. The device testing system of claim 9, comprising:
a measurement circuit, coupled to the device, the control circuit, and to the digital signal processor;
wherein the measurement circuit is configured to detect and output to the digital signal processor a signal representative of a peak-to-peak voltage provided to the device during at least one of the start-up, charge and test modes.

12. The device testing system of claim 9, comprising:
a measurement circuit, coupled to the device, the control circuit, and to the digital signal processor;
wherein the measurement circuit is configured to detect and output to the digital signal processor a signal representative of a peak voltage provided to the device during at least one of the start-up, charge and test modes.

13. The device testing system of claim 1, comprising:
an environmental control circuit, coupled to the digital signal processor, configured to monitor and adjust environmental conditions for the device during test mode.

14. The device testing system of claim 1,
wherein the energy capture circuit comprises at least one capacitive device.

15. The device testing system of claim 1,
wherein the device is a capacitor.

16. A method for testing a device, comprising:
coupling a device under test with an energy capture circuit to provide a recovered voltage to the device under test;
upon providing of the recovered voltage to the device under test,
  measuring the current voltage of the device under test;
  determining whether the current voltage is substantially equal to a desired test voltage;

when the current voltage is less than the desired test voltage:
coupling the device under test with a primary power source while monitoring voltages arising across the device under test until the current voltage is substantially equal to the desired test voltage:
decoupling the device under test from the primary power source; and
decoupling the device under test from the energy capture circuit;
when the current voltage is substantially equal to the desired test voltage:
first testing the device;
monitoring voltages and currents arising across the device during first testing; and
discharging the device.

17. The method of claim 16,
wherein the recovered energy is captured by the energy capture circuit during a prior testing of the device that immediately preceded the first testing of the device.

18. The method of claim 17,
wherein the energy capture circuit and the device under test are initially charged by a primary power source controlled by a digital signal processor;
wherein the device under test is selectively coupled to the primary power source by a first switch configured by a control circuit based upon a first control signal received from the digital signal processor;
wherein the energy capture circuit is selectively coupled to the device under test by a second switch;
wherein the second switch is selectively configured by the control circuit based upon a second control signal received from a digital signal processor;
wherein the device under test is selectively coupled to a primary neutral node by a third switch;
wherein the third switch is selectively configured by the control circuit based upon a third control signal received from the digital signal processor;
wherein the third switch is open during first testing of the device;
wherein the third switch is closed to discharge the device; and
wherein the second switch and the third switch are configured in polar opposite configurations during first testing and discharging the device.

19. A capacitor testing system, comprising:
a digital signal processor;
wherein the digital signal processor is configured to execute non-transient computer executable instructions for testing a device over at least three operating modes comprising:
a start-up mode, during which the digital signal processor is configured to control initial charging of the device to a desired initial condition;
a charge mode, during which the digital signal processor is configured to control replenishment of electrical energy in the device;
a test mode, during which the digital signal processor is configured to control testing of the device in accordance with at least one testing protocol;
an energy capture circuit, coupled to the device;
wherein the energy capture circuit is configured to capture recovered energy arising during testing of the device during a first test cycle;
wherein the energy capture circuit is configured to provide the recovered energy to the device for use during a second test cycle;
a control circuit, coupled to the digital signal processor, configured to at least one of:
couple the device to the primary power source during charge mode;
decouple the device from the primary power source during test mode;
couple the device to the energy capture circuit during charge mode;
decouple the device from the energy capture circuit during test mode;
couple the device to a primary neutral node during test mode; and
decouple the device from the primary neutral node during charge mode;
a measurement circuit, coupled to the device, the control circuit, and to the digital signal processor;
wherein the measurement circuit is configured to detect and output to the digital signal processor a signal representative of a current provided to the device during at least one of the start-up mode, the charge mode and the test mode;
and
an environmental control circuit, coupled to the digital signal processor, configured to monitor and adjust environmental conditions for the device during at least the test mode.

20. The capacitor testing system of claim 19,
wherein the measurement circuit is configured to detect and output to the digital signal processor a signal representative of a peak-to-peak voltage provided to the device during at least one of the start-up mode, the charge mode, and the test mode; and
wherein the measurement circuit is configured to detect and output to the digital signal processor a signal representative of a peak voltage provided to the device during at least one of the start-up mode, the charge mode, and the test mode.

* * * * *